United States Patent
Suzuki et al.

[11] Patent Number: 5,346,554
[45] Date of Patent: Sep. 13, 1994

[54] APPARATUS FOR FORMING A THIN FILM

[75] Inventors: Mizuaki Suzuki; Matsuo Kishi, both of Tokyo, Japan

[73] Assignee: Seiko Instruments Inc., Japan

[21] Appl. No.: 684,062

[22] Filed: Apr. 11, 1991

[30] Foreign Application Priority Data

| | | | |
|---|---|---|---|
| Apr. 12, 1990 | [JP] | Japan | 2-98320 |
| Jun. 6, 1990 | [JP] | Japan | 3-148042 |
| Nov. 16, 1990 | [JP] | Japan | 2-310278 |

[51] Int. Cl.⁵ .................................................. C23C 14/30
[52] U.S. Cl. ................................. 118/723 EB; 118/726; 219/121.15; 219/121.27; 219/121.29
[58] Field of Search ............ 118/726, 723 EB; 219/121.15, 121.27, 121.29

[56] References Cited

U.S. PATENT DOCUMENTS

| | | | |
|---|---|---|---|
| 3,622,679 | 11/1971 | Kennedy | 219/121.15 |
| 3,814,829 | 6/1974 | Movchan | 219/121.15 |
| 4,620,081 | 10/1986 | Zeren | 219/121.15 |
| 4,863,581 | 9/1989 | Inokuti | 118/726 |

FOREIGN PATENT DOCUMENTS

| | | | |
|---|---|---|---|
| 59-41473 | 3/1984 | Japan | 118/723 EB |
| 59-177372 | 10/1984 | Japan | 118/723 EB |
| 60-46367 | 3/1985 | Japan | 118/723 EB |
| 63-259073 | 10/1988 | Japan | 118/723 EB |

*Primary Examiner*—Richard Bueker
*Attorney, Agent, or Firm*—Bruce L. Adams; Van C. Wilks

[57] ABSTRACT

An apparatus for forming a thin film irradiates an electron beam on a vaporizable substance held in a crucible. A pair of electromagnets are disposed in coplanar relation and at right angles to each other to generate a magnetic field which deflects the electron beam. An alternating current is applied to the electromagnets to generate the magnetic field, and the magnitude and frequency of the current are controlled so as to scan the electron beam in a circular pattern on the vaporizable substance.

6 Claims, 15 Drawing Sheets

FIG. 3(a)
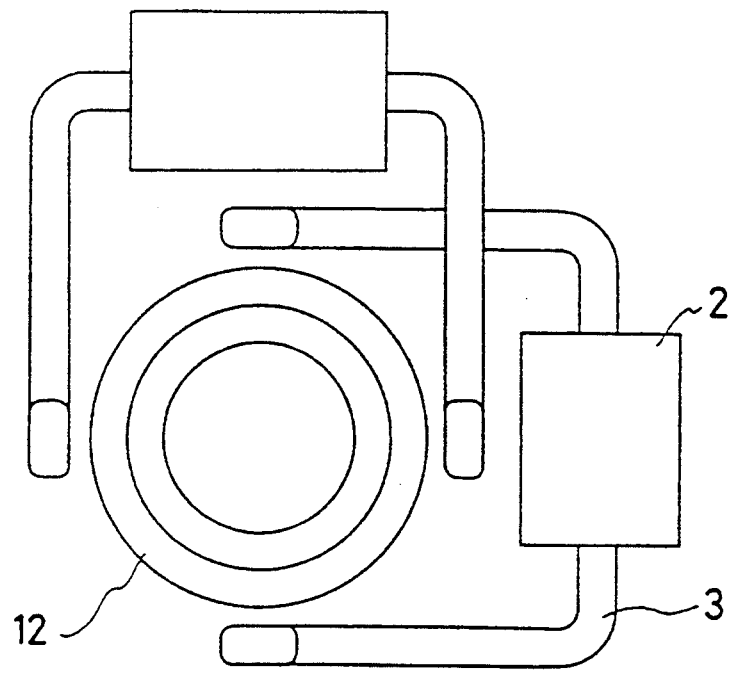
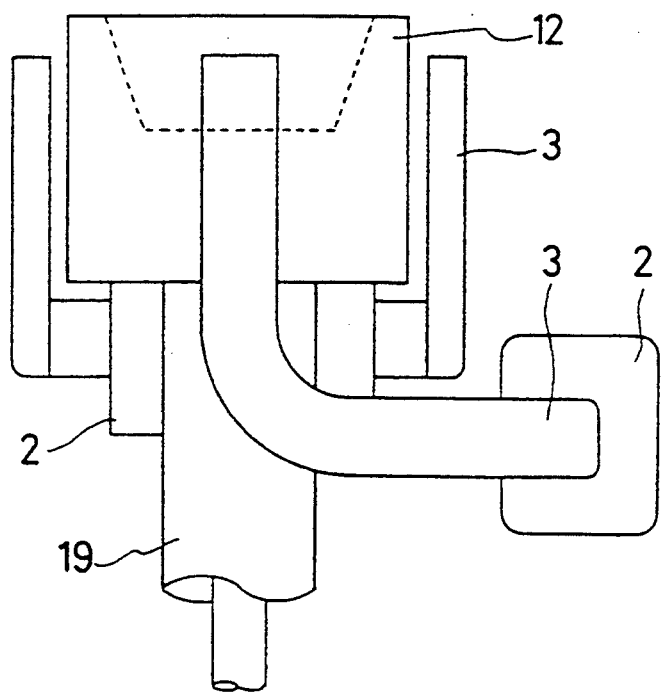
FIG. 3(b)

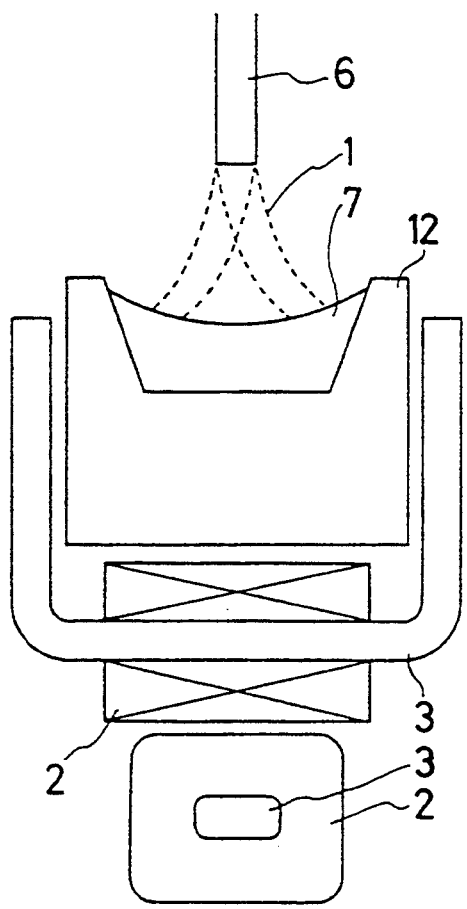
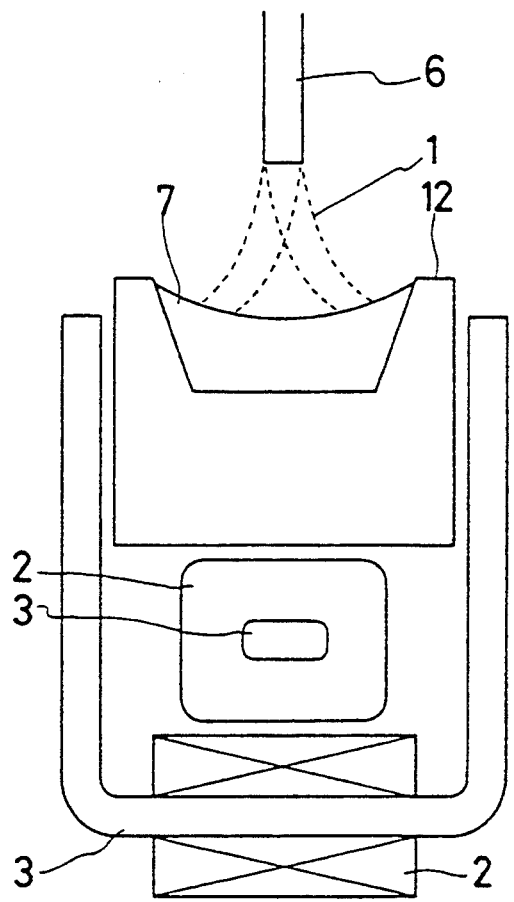

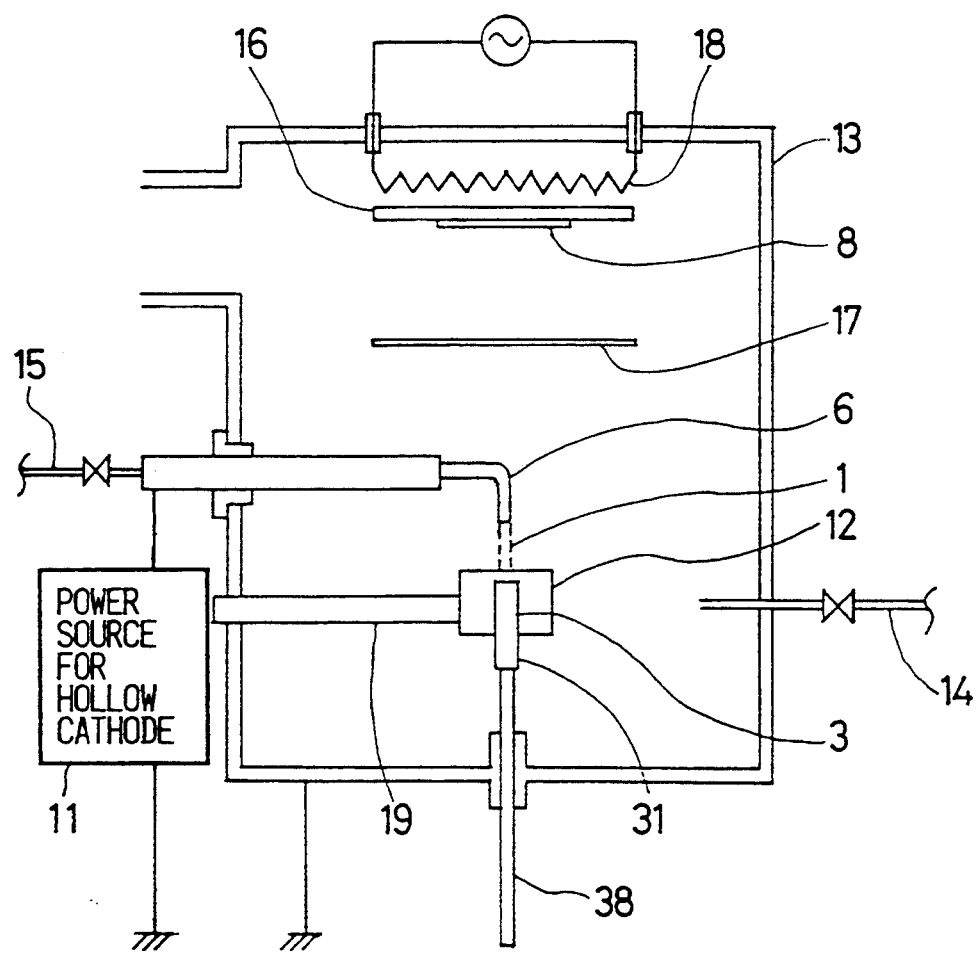

APPARATUS FOR FORMING A THIN FILM

BACKGROUND OF THE INVENTION

The present invention relates to an apparatus for forming a thin film consisting of a metal nitride or a metal oxide on a substrate that is to be treated.

According to the prior art, only narrow regions on the surface of the vaporizable substance could be locally irradiated with the electron beam generated by the hollow cathodic discharge, but wide areas on the surface of the vaporizable substance could not be scanned with the deflected electron beam.

To obtain a thin nitride film such as of silicon nitride or aluminum nitride, or a thin oxide film, such as of silicon oxide or aluminum oxide, a nitrogen gas or an oxygen gas is introduced into a vacuum vessel.

In this case, the vaporizable substance, such as silicon or aluminum heated at high temperatures in a crucible, is exposed to a nitrogen atmosphere or an oxygen atmosphere, and is nitrogenated or is oxidized to a considerable degree. The vaporizable substance exhibits a high melting point when it is nitrogenated or oxidized. Therefore, the vaporizable substance is not easily melted, and only a narrow area directly irradiated with the electron beam is heated at particularly high temperatures and melts and vaporizes. Accordingly, the vaporizable substance is not uniformly melted, and a hole is formed in a portion of the vaporizable substance by the electron beam. In other words, the vaporizable substance assumes the condition like in the crucible of the prior art forming a nitride layer 20 and a locally molten portion as shown in a section view of FIG. 14. Under such a condition, the vaporizable substance in the crucible is vaporized only partly whereby the rate of vaporization becomes unstable and the deposition time becomes short making it difficult to form the film up to a desired thickness.

Moreover, the electron beam forms a hole in the vaporizable substance so deeply that the crucible is often damaged.

According to the prior art in which a narrow area on the surface of a vaporizable substance is locally irradiated with an electron beam generated by the hollow cathodic discharge, the aforementioned problem takes place easily. The spot size of electron beam becomes small because of the pinch effect by the magnet field established by the electron beam itself. In order to magnify the spot size of electron beam, the magnetic field must be arranged and must have some strength. But it is difficult to provide a coil which established the magnetic field because a discharge current is as great as from several tens to several hundreds of amperes and the distance between the hollow cathode and crucible is several centimeters.

Moreover, when a voltage of a high frequency is applied as a bias to the substrate that is to be treated according to the prior art, the rate of vaporization of a vaporizable substance becomes unstable. Therefore, the density of ions is not stabilized in the atmosphere, the high-frequency impedance is not matched well, and a matching device must be frequently adjusted during processing.

FIG. 15 is a diagram showing an electron beam that is deflected by a magnetic field in an apparatus according to prior art.

A discharge current produced by the hollow cathodic discharge is so great as aforementioned that the electron beam 1 is deflected by an intense magnetic field 33 established by the discharge current. The deflected electron beam can hardly by focused on the center of the crucible 12. Therefore, the vaporizable substance 7 in the crucible 12 is not uniformly melted or is not vaporized for a long period of time, and the crucible 12 may be damaged by the deflected electron beam 1.

SUMMARY OF THE INVENTION

It is an object of the present invention to irradiate a relatively wide area on the surface of the vaporizable substance with the electron beam.

According to the present invention, a permanent magnet or an electromagnet is provided which generates a magnetic field to deflect the electron beam generated from a hollow cathode. A relatively wide area on the surface of the vaporizable substance is irradiated with the electron beam in a scanning manner eliminating the problem in that the vaporizable substance is irradiated and heated only locally. Therefore, even the areas that begin to be nitrogenated or oxidized are irradiated with the electron beam and are heated and vaporized, such that very little nitrogenated layer or the oxidized layer is formed.

Moreover, in order to prevent the aforementioned damage by the deflected electron beam, the present invention employs a permanent magnet or an electromagnet which generates a magnetic field to correct the deflection.

BRIEF DESCRIPTION OF THE DRAWINGS

FIGS. 2(a) 2(b) 3(a) and 3(b) are diagrams showing major portions about a crucible of the embodiment 1 of the present invention, wherein the diagrams (a) are plan views and the diagrams (b) are side views;

FIGS. 4(a) and 4(b) are section views showing the condition of the vaporizable substance in the crucible as viewed from different directions according to the embodiment 1 of the present invention;

FIG. 9 is a section view showing the outline of an embodiment 4 of the present invention;

DESCRIPTION OF THE INVENTION

Embodiments of the invention will now be described in conjunction with the drawings,

EMBODIMENT 1

Figure 1:
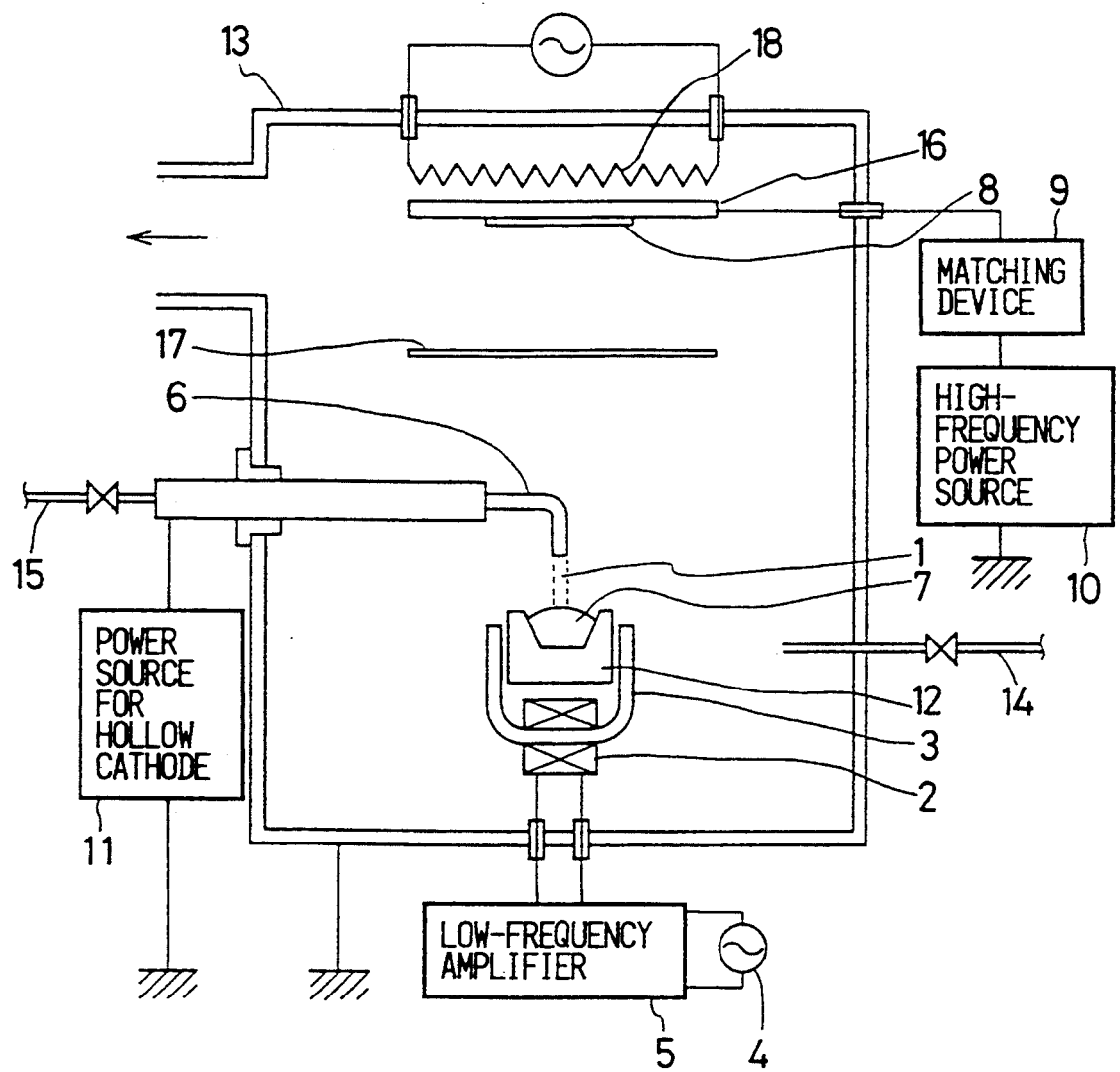
FIG. 1 is a front section view showing the outline of an embodiment 1 of the present invention.
Figure 2A:
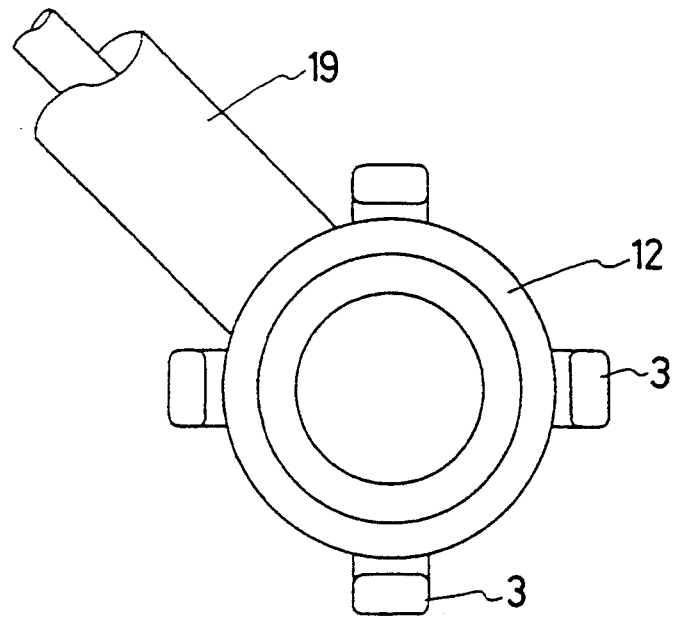
Figure 2B:
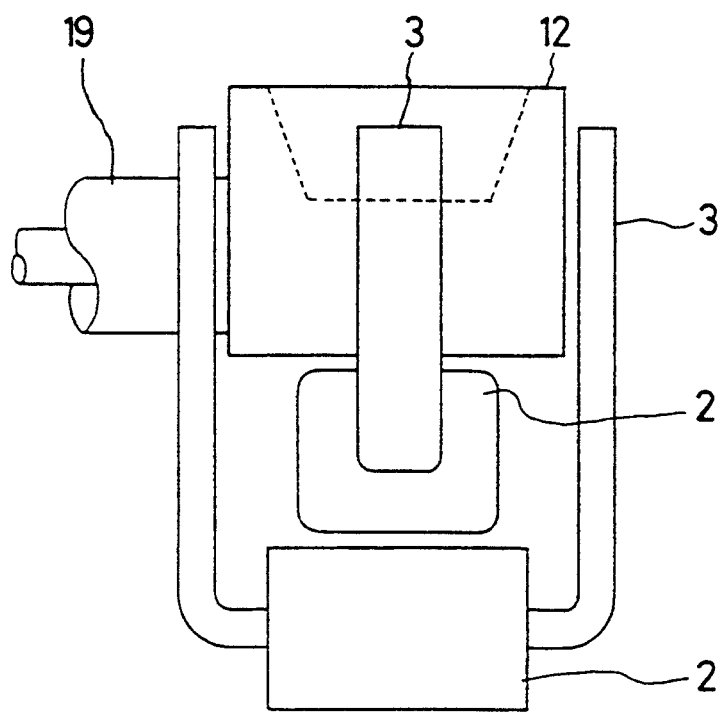

FIG. 1 is a front section view showing the outline of the embodiment 1. FIGS. 2(a), 2(b), 3(a) and 3(b) are diagrams showing the outline about a crucible of the embodiment, wherein the diagrams (a) are plan views and the diagrams (b) are front views.

An electromagnet that generates a magnetic field for deflecting the electron beam 1 is constituted by a coil 2 and a core 3, and is driven by a low-frequency oscillator 4 and a low-frequency amplifier 5. The strength of the magnetic field generated by the electromagnet is ten to several tens of gausses near a hollow cathode 6. In supplying an alternating current to the electromagnet to scan the electron beam 1, the magnitude and frequency of the current driving the electromagnet are changed in order to change the amplitude and speed of the scanning of the electron beam 1. It is effective for melting uniformly the vaporizable substance that the alternating frequency of the electric power driving the electromagnetic is set lower than 1 kHz.

Since two electromagnets are arranged at right angles with each other as shown in FIG. 2 or FIG. 3, the electromagnets deflect and scan the electron beam 1 two-dimensionally in any direction.

It was attempted to form an aluminum nitride film and a silicon nitride film using an apparatus for forming a thin film of the embodiment. Unlike the conventional method, however, the surface of the vaporizable substance 7 was not remarkably nitrogenated or a deep hole was not formed in the vaporizable substance by the electron beam 1. FIGS. 4(a) and 4(b) are section views schematically showing the condition of the vaporizable substance in the crucible according to the embodiment 1.

EMBODIMENT 2

Figure 5:
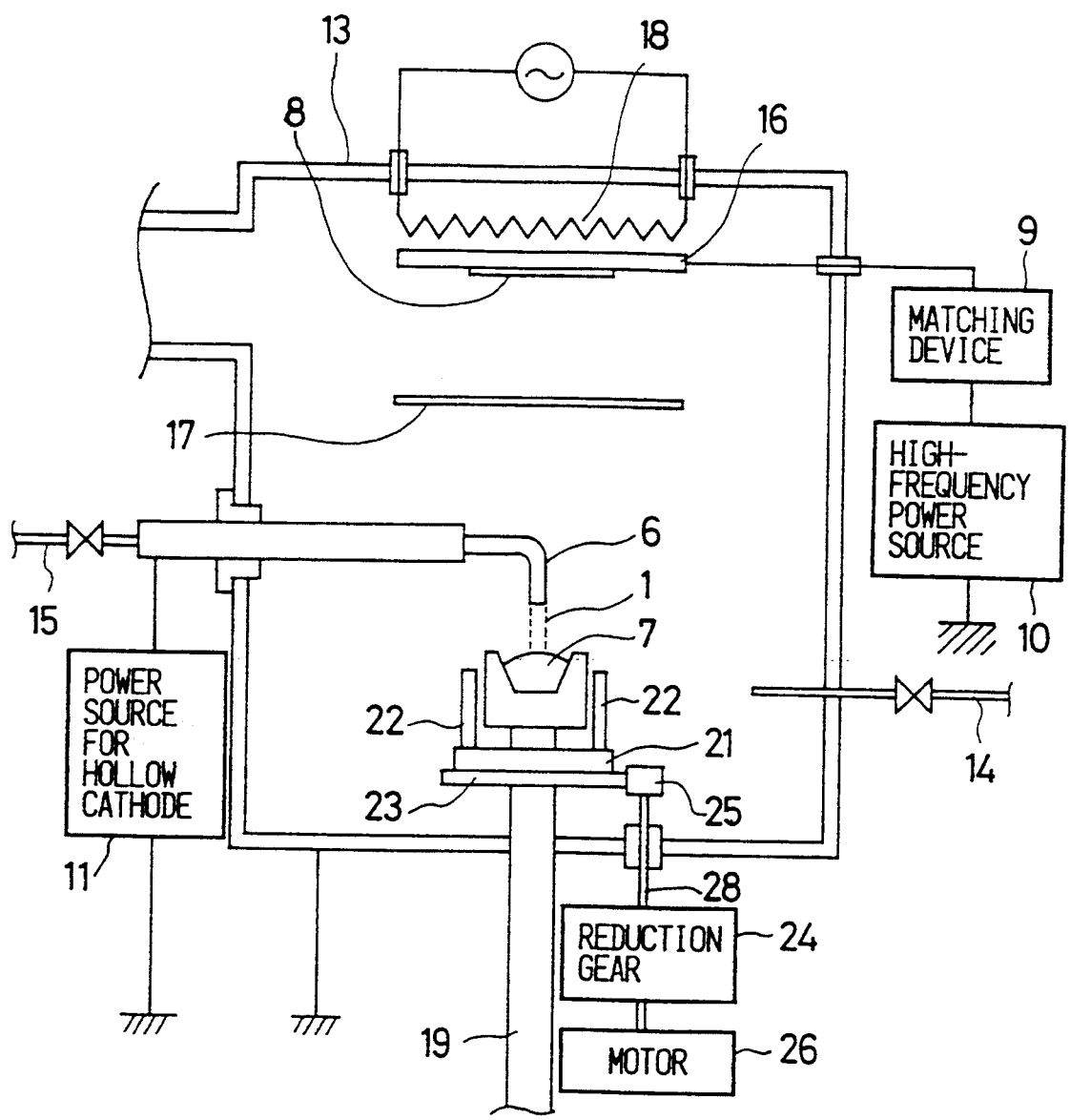
FIG. 5 is a front section view showing the outline of the apparatus according to an embodiment 2 of the present invention.
Figure 6:
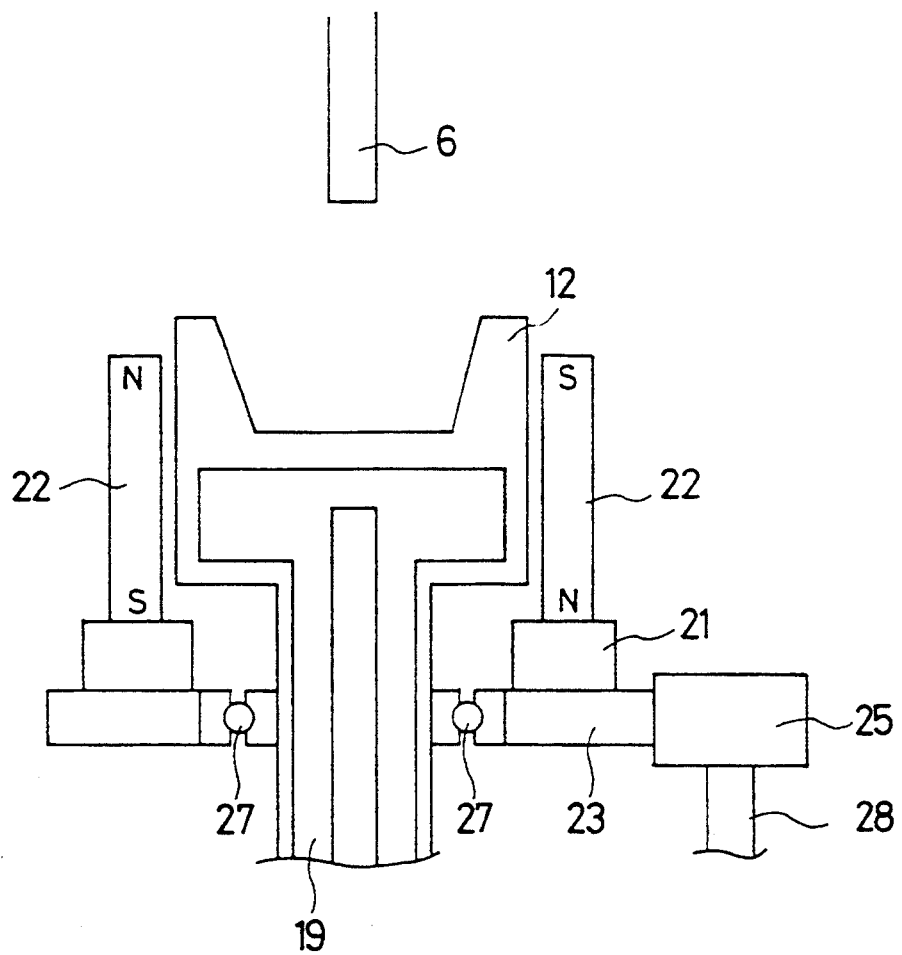
FIG. 6 is a section view about the crucible of the embodiment 2.

FIG. 5 is a front section view showing the outline of the embodiment 2, and FIG. 6 is a section view which schematically illustrates major portions about the crucible of the embodiment 2.

The magnet-holding ring 21 has a magnet 22 and a gear 23, and is made of an electromagnetically soft steel that permits the magnetic flux to pass through easily. The magnet-holding ring 21 is driven by a motor 26 via a reduction gear 24 and a gear 25, and rotates round a crucible 12. Further, a bearing 27 is employed for smooth rotation.

The direction of magnetic field generated by the magnet 22 rotates accompanying the rotation of the magnet 22. Therefore, the direction of Lorentz force that deflects the electron beam 1 rotates, too, enabling a vaporizable substance 7 to be irradiated with the electron beam 1 in a scanning manner.

The strength of the magnetic field generated by the magnet 22 is about several to several tens of gausses near a hollow cathode 6.

The scanning speed of the electron beam 1 can be changed by changing the rotational speed of the magnet 22.

Figure 8:
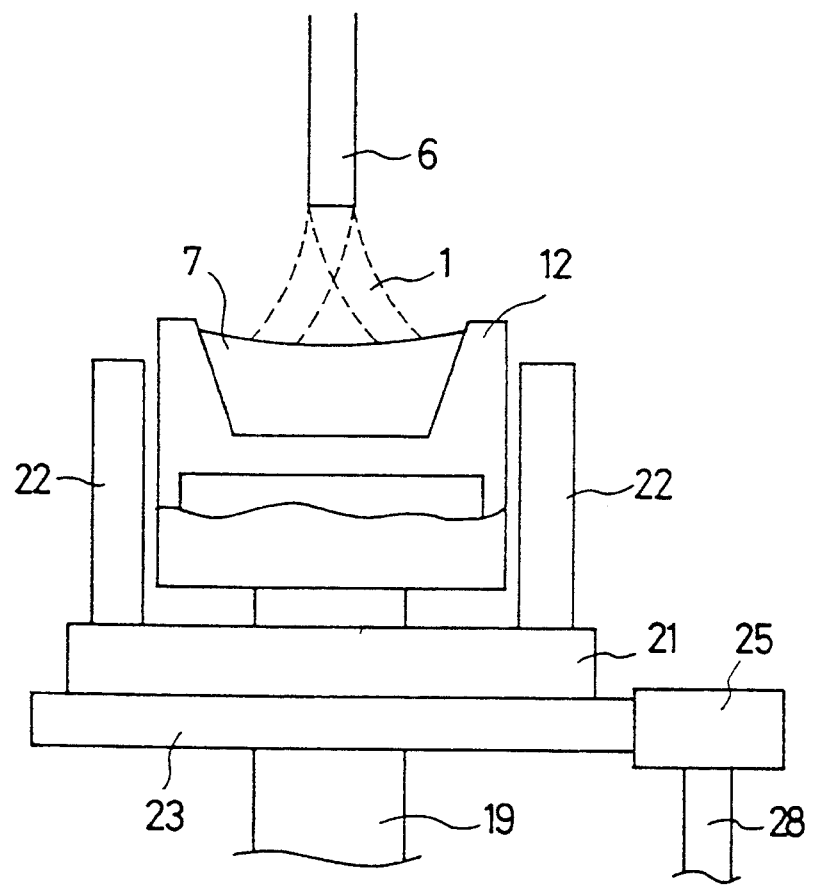
FIG. 8 is a section view which schematically shows the condition of the vaporizable substance in the crucible according to the embodiment.

It was attempted to form an aluminum nitride film and a silicon nitride film using an apparatus for forming a thin film of the embodiment. Unlike the conventional method, however, the surface of the vaporizable substance was not remarkably nitrogenated or a deep hole was not locally formed in the vaporizable substance by the electron beam 1. FIG. 8 is a section view schematically showing the condition of the vaporizable substance in the crucible according to the embodiment 2.

EMBODIMENT 3

Figure 7:
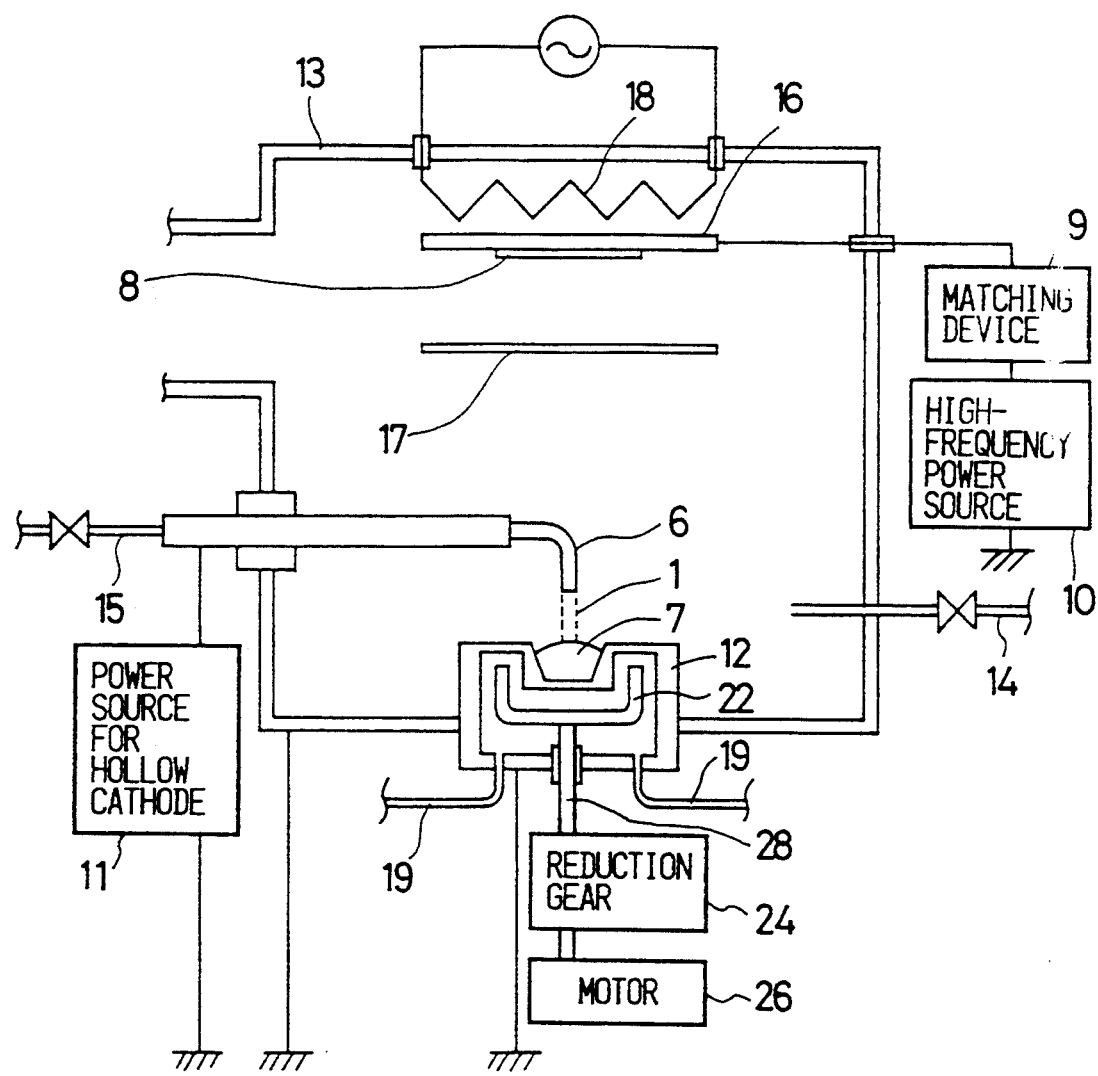
FIG. 7 is a front section view showing the outline of the apparatus according to an embodiment 3 of the present invention.

FIG. 7 is a front section view showing the outline according to an embodiment 3.

A magnet 22 is driven and rotated by the motor 26 via a reduction gear 24. The direction of magnetic field rotates accompanying the rotation of the magnet 22, and the vaporizable substance 7 is irradiated with the electron beam 1 in a scanning manner.

A this aluminum nitride film was formed using the apparatus of the embodiment 3, and the same effects as those of the embodiment 2 were obtained.

EMBODIMENT 4

Figure 13A:
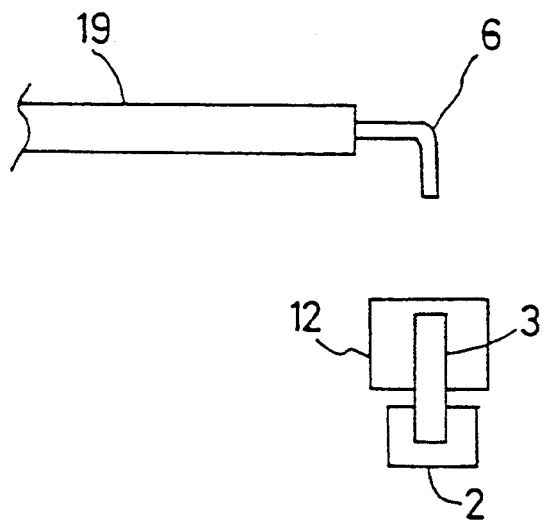
FIGS. 13(a) and 13(b) are diagrams for explaining the operation of the present invention.
Figure 13B:
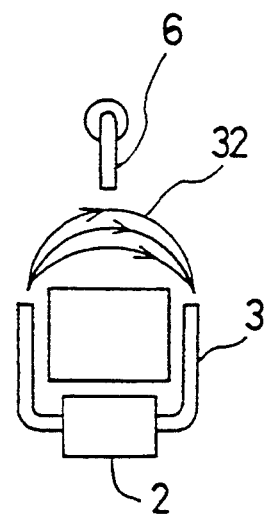
Figure 14:
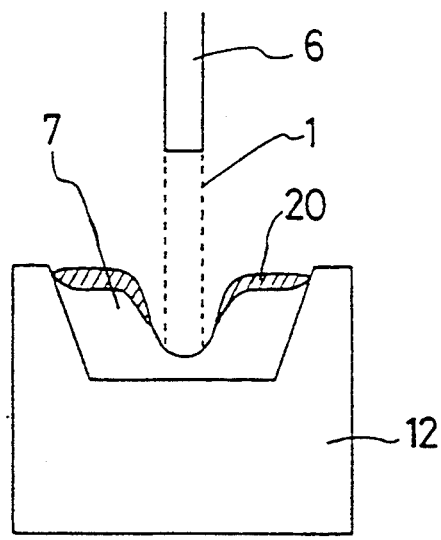
FIG. 14 is a section view showing the condition of the vaporizable substance in the crucible according to the prior art.
Figure 15A:
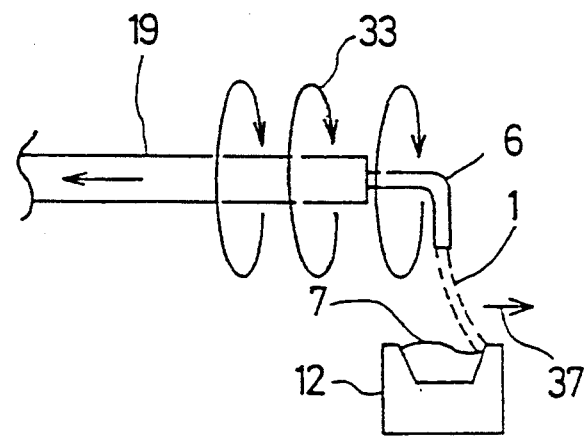
FIG. 15 is a diagram explaining the deflection of the electron beam caused by a magnetic field in an apparatus according to a prior art.
Figure 15B:
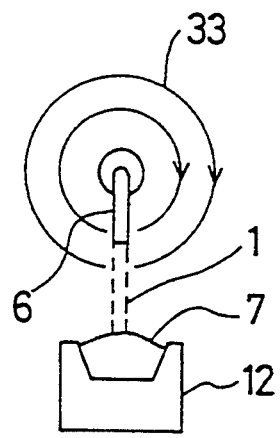

FIG. 13 is a diagram illustrating the operation of the present invention.

The electron beam 1 is deflected by the Lorentz force 37 of magnetic field 33 established by a discharge current of hollow cathodic discharge. Therefore, a permanent magnet or an electromagnet is used to generate a corrective magnetic field 32 for canceling the magnetic field 33 established by the discharge current, and whereby the deflection of the electron beam 1 is corrected.

The strength of the magnetic field increases or decreases with an increase or a decrease in the discharge current. Therefore, when the permanent magnet is used to effect the correction, the distance is increased or decreased with respect to the hollow cathode in order to adjust the strength of the magnetic field 32 for correction and when the electromagnet is used, the electric current supplied to the electromagnet is increased or decreased in order to adjust the strength of the magnetic field 32 for correction. The strength of the magnetic field generated by the current varies in proportion to the magnitude of the current. When the electromagnet is used, therefore, a power source device is provided for varying the magnitude of current flowing into the electromagnet in proportion to the magnitude of current of the hollow cathodic discharge, and whereby the magnetic field is properly corrected at all times irrespective of an increase or a decrease in the discharge current.

Figure 10A:
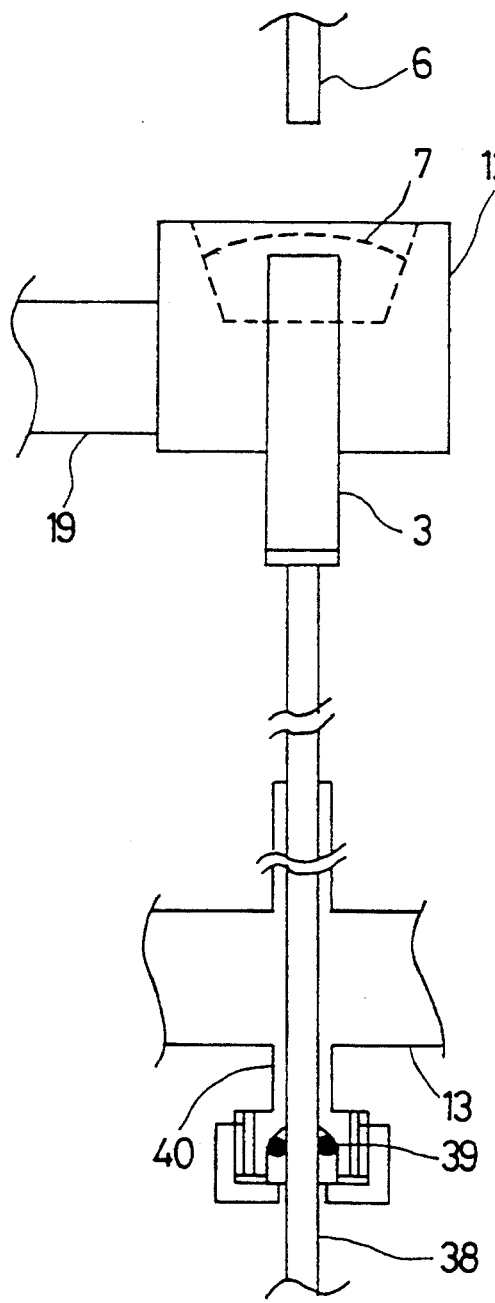
FIGS. 10(a) and 10(b) are section views showing major portions of the embodiment 4 of the present invention.
Figure 10B:
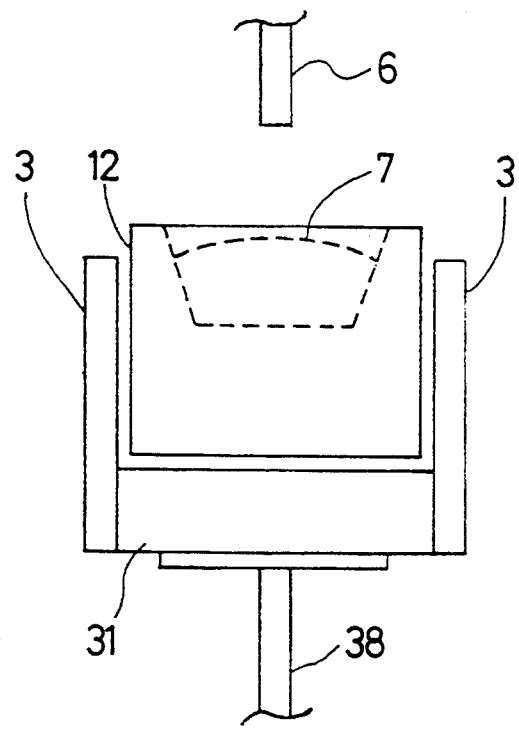

FIG. 9 is a section view showing the outline according to the present invention, FIG. 10(a) is a plan view showing major portions of the present invention, and FIG. 10(b) is a diagram showing major portions of the present invention.

A permanent magnet 31 and an iron core 3 are provided in a vacuum vessel 13 under a hollow cathode 6 and a crucible 12 to correct the deflection of electron beam 1. In the proximity of the hollow cathode 6, the direction of the magnetic field 32 for correction is opposite to that of the magnetic field 33 established by a discharge current of hollow cathodic discharge. The permanent magnet 31 supported by a support portion 38 moves up and down to adjust the distance relative to the hollow cathode 6 and, hence, to adjust the strength of the magnetic field 32 for correction near the hollow cathode 6. The strength of the magnetic field that is required ranges from several to several tens of gausses near the hollow cathode 6.

Materials such as titanium, aluminum and silicon were vaporized using the apparatus of the embodiment and vaporization could be stably carried out in all of these cases, making it possible to form thin films favorably.

EMBODIMENT 5

Figure 11:
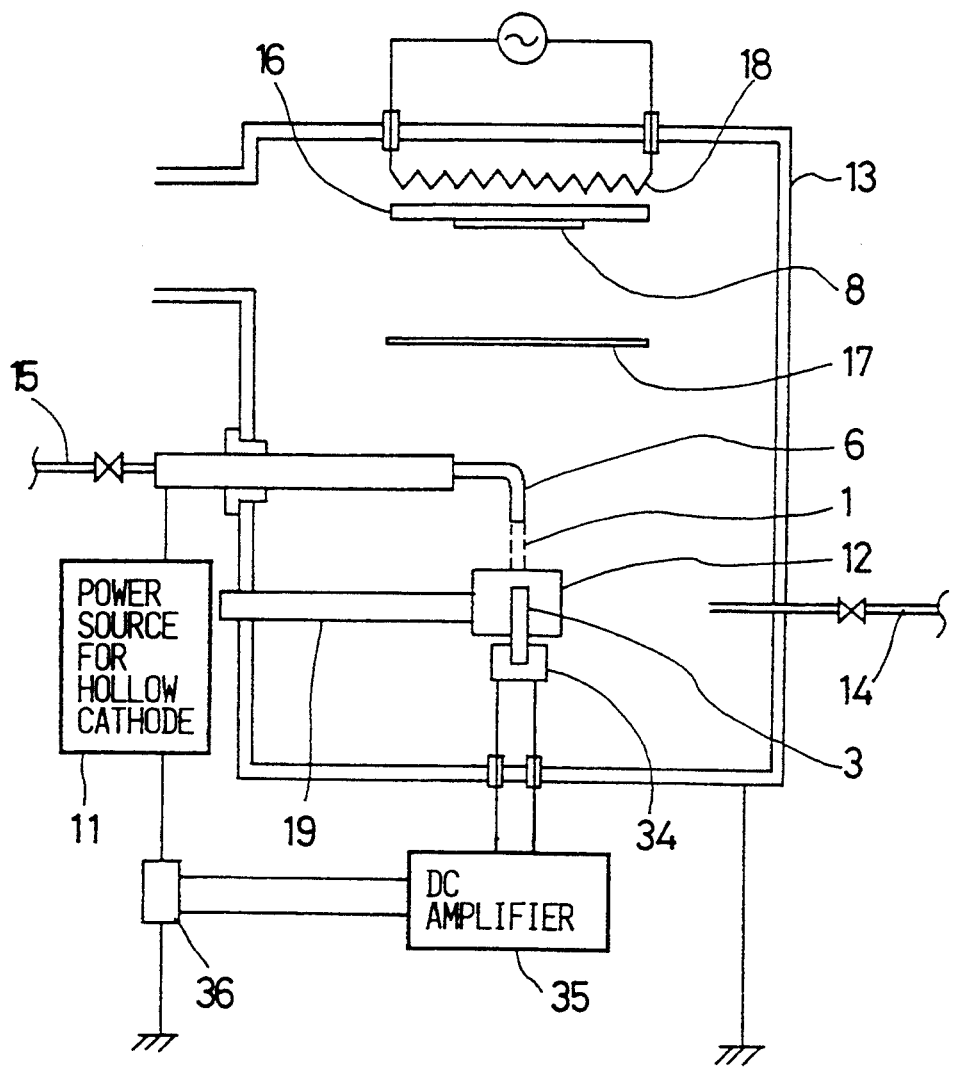
FIG. 11 is a section view showing the outline of an embodiment 5 of the present invention.
Figure 12A:
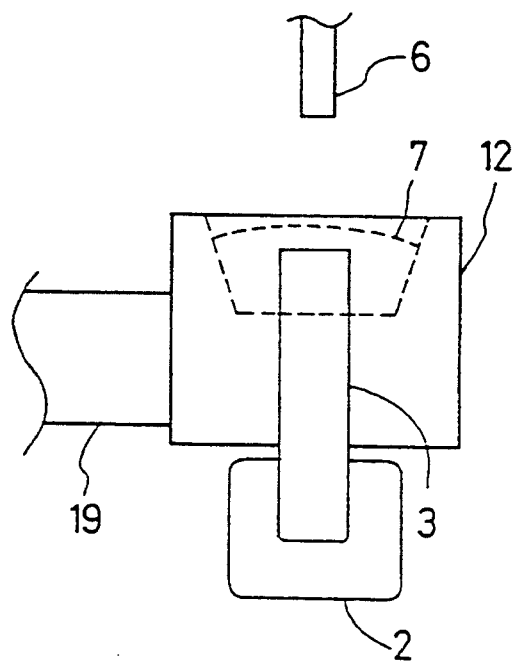
FIGS. 12(a) and 12(b) are partial section views showing major portions of the embodiment 5 of the present invention.
Figure 12B:
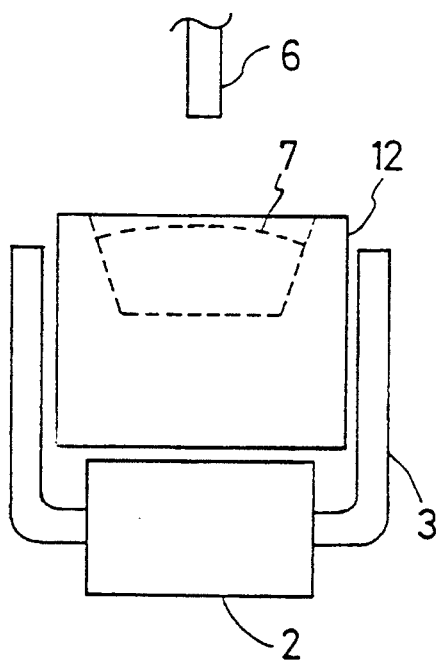

FIG. 11 is a section view showing the outline according to the present invention, FIG. 12(a) is a plan view showing major portions according to the present invention, and FIG. 12(b) is a diagram showing major portions according to the present invention.

An electromagnet 34 is provided in the vacuum vessel 13 under the hollow electrode 6 and the crucible 12 to correct the deflection of electron beam 1. The electromagnet 34 is constituted by a coil 2 and an iron core 3. The direction of the magnetic field 32 for correction is opposite to that of the magnetic field 33 established by the discharge current of hollow cathodic discharge.

The electromagnet 34 is driven by a DC amplifier 35. The strength of the magnetic field 32 for correction can be adjusted by adjusting the magnitude of electric current flowing into the coil 2. A current detector 36 such as a shunt resistor or a Hall element is inserted in an electric circuit for hollow cathodic discharge in order to detect the magnitude of the discharge current, and the detected value is input to the DC amplifier 35, such that the magnitude of the discharge current varies in proportion to the magnitude of the current that flows into the coil 2. This enables the electromagnet to establish the magnetic field 32 for correction having a strength proportional to the strength of the magnetic field 33 established by the discharge current of hollow cathodic discharge. If the amplification factor of the DC amplifier 35 has been adjusted in advance, the deflection of the electron beam 1 can be suitably corrected irrespective of an increase or a decrease in the magnitude of the discharge current.

Materials such as titanium, aluminum and silicon were vaporized using the apparatus of the embodiment and vaporization could be stably carried out in all of these cases, making it possible to form thin films favorably.

Furthermore, it was attempted to apply a high-frequency voltage as a bias to the substrate 8 to be treated while the film was being formed, but there was no need of frequently adjusting the matching device 9 unlike that of the prior art.

Figure 16:
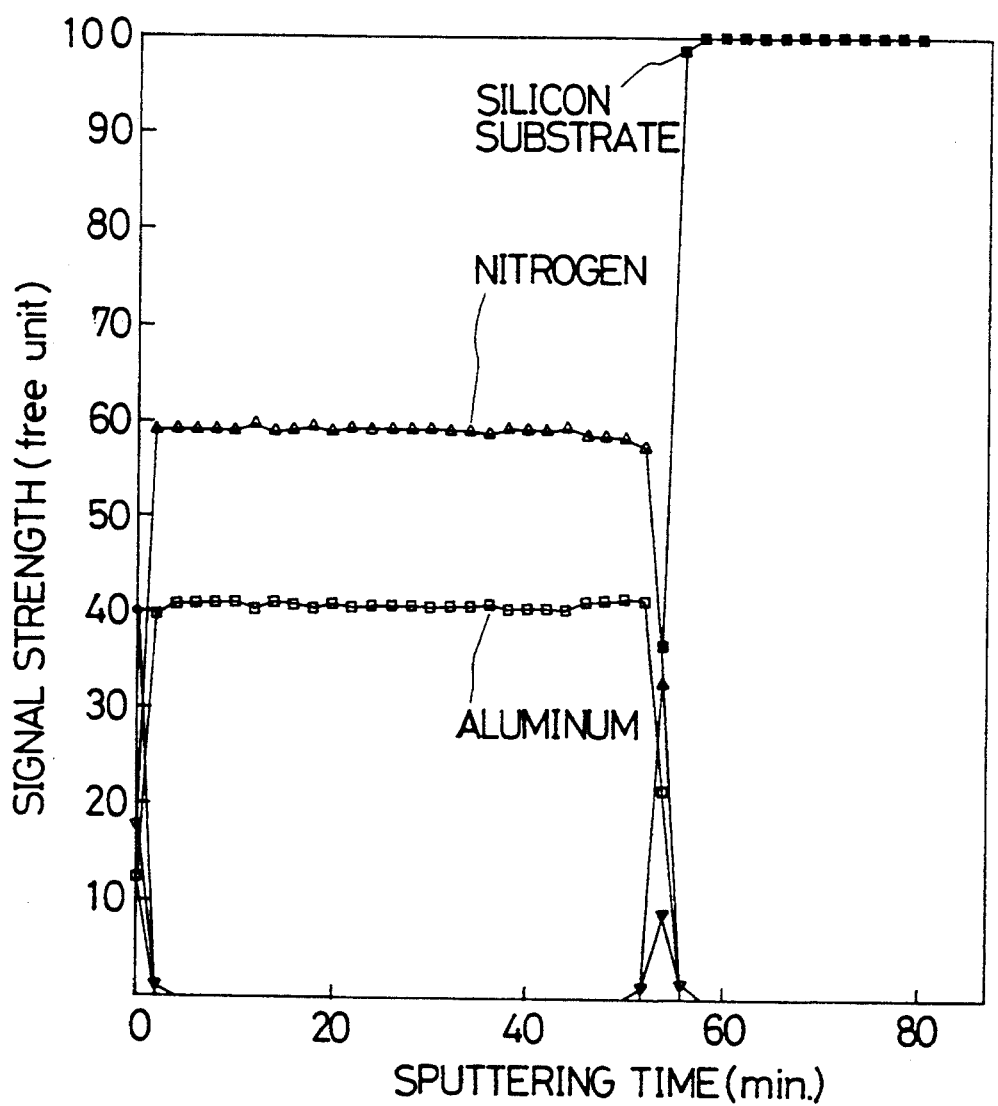
FIG. 16 is a diagram of characteristics showing the results of Auger electron spectroanalysis of the aluminum nitride film formed according to the embodiment.
Figure 17:
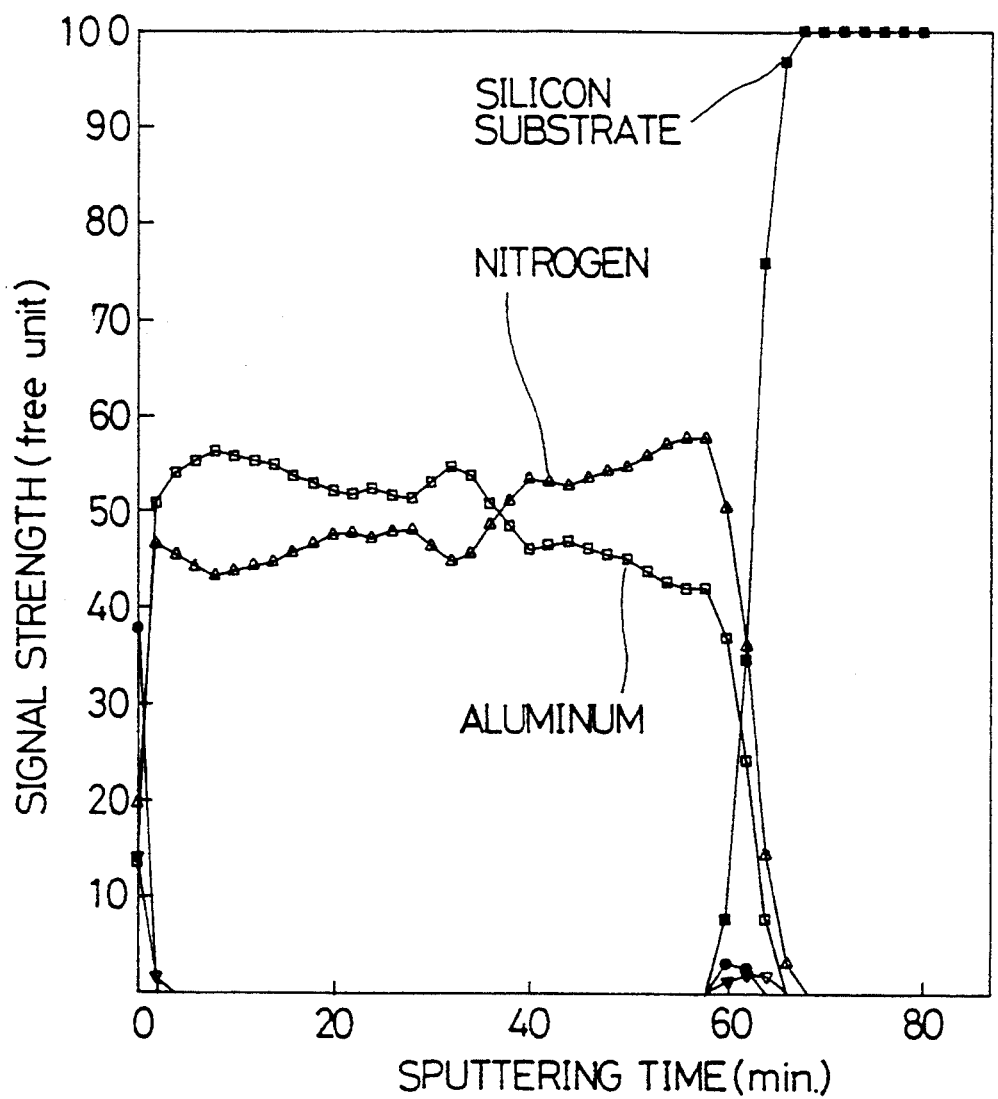
FIG. 17 is a diagram of characteristics showing the results of Auger electron spectroanalysis of the aluminum nitride film formed according to the prior art.

FIG. 16 shows the results of Auger electron spectroanalysis of the aluminum nitride film formed according to the embodiment, and FIG. 17 shows the results of Auger electron spectroanalysis of the aluminum nitride film formed according to the prior art. According to this embodiment, since the rate of vaporization of aluminum is stable, the film is formed having a uniform composition in the direction of thickness.

Contrary to the above, it is also allowable to change the discharge current of the hollow cathodic discharge and the flow rate of nitrogen gas with the passage of time during the treatment, in order to obtain a compound film having a composition that changes in the direction of the thickness of film.

There does not develop such a condition in which the vaporizable substance is vaporized only partly to dig a hole, and the time of vaporization is lengthened compared to that of the prior art. Moreover, there is no probability of damaging the crucible.

The rate of vaporization of the vaporizable substance is stabilized compared with that of the prior art. Therefore, the film that is formed has a homogeneous quality in the direction of the thickness of film. It is also allowable to control the amount of vaporization in order to obtain a compound film having a composition that changes in the direction of the thickness of film. Furthermore, when a high-frequency voltage is applied as a bias to the substrate that is to be treated, the rate of vaporization is stabilized and the impedance matching can be easily accomplished between the power source and the load.

Moreover, the deflection of an electron beam is corrected so that the electron beam falls on the center of the crucible. Therefore, the vaporizable substance melts uniformly in the crucible. Furthermore, there is no likelihood that the crucible is damaged by the deflected electron beam.

What is claimed is:

1. An apparatus for forming a thin film comprising:
   means for generating an electron beam by a hollow cathodic discharge;
   a crucible for holding a vaporizable substance;
   means comprising two electromagnets arranged at right angles to each other near the crucible for generating a magnetic field effective to scan the electron beam on the vaporizable substance, each electromagnet having a core having a north pole end and a south pole end facing each other across the crucible; and
   means for supplying an alternating current to the two electromagnets to effect scanning of the electron beam in a two-dimensional pattern on the vaporizable substance.

2. An apparatus comprising: a crucible for holding a vaporizable substance to be vaporized; means for generating an electron beam by a hollow cathodic discharge; and means for magnetically deflecting the electron beam to effect scanning thereof in a two-dimensional pattern on the vaporizable substance to thereby vaporize the vaporizable substance, the means for magnetically deflecting the electron beam comprising a pair of electromagnets, each electromagnet having a core which terminates in two opposite ends and an energizable coil wound on the core, and the two opposite ends of each core being disposed on opposite sides of the crucible, and means for energizing the coils to generate a magnetic field for magnetically deflecting the electron beam.

3. An apparatus according to claim 2; wherein the two ends of both cores lie in a common plane.

4. An apparatus according to claim 2; wherein the two ends of both cores lie in a common plane together with the crucible.

5. An apparatus according to claim 2; wherein the means for energizing the coils includes means for flowing an alternating current through the coils, and means for controlling the magnitude and frequency of the alternating current to thereby control the amplitude and speed of scanning of the electron beam.

6. An apparatus according to claim 2; wherein the pair of energizable electromagnets are located at right angles to each other near the crucible.

* * * * *